United States Patent [19]

Tsymberov

[11] Patent Number: 5,637,200
[45] Date of Patent: Jun. 10, 1997

[54] COMPACT DISK LOCKING APPARATUS

[75] Inventor: Leonid Tsymberov, Stoughton, Mass.

[73] Assignee: Nobler Technologies, Inc., Stoughton, Mass.

[21] Appl. No.: 385,276

[22] Filed: Feb. 8, 1995

[51] Int. Cl.$^6$ .............. C23C 14/50; C23C 16/00; B23Q 3/08
[52] U.S. Cl. ............ 204/298.15; 118/728; 118/729; 156/345; 369/270; 269/22; 269/34; 269/47; 269/52; 269/238
[58] Field of Search ............ 204/298.15; 118/728, 118/729; 156/345; 269/22, 34, 47, 52, 238; 360/99.05, 99.12; 369/270, 271

[56] References Cited

U.S. PATENT DOCUMENTS

| | | | |
|---|---|---|---|
| 4,755,981 | 7/1988 | Ekhoff | 360/99.12 |
| 4,948,187 | 8/1990 | Blaseck | 294/95 |
| 5,014,143 | 5/1991 | Mori et al. | 360/99.12 |
| 5,025,340 | 6/1991 | Peters | 369/270 |
| 5,056,082 | 10/1991 | Ekhoff | 369/270 |
| 5,166,920 | 11/1992 | Kogure | 369/271 |
| 5,195,794 | 3/1993 | Hummel, Jr. et al. | 294/94 |
| 5,275,424 | 1/1994 | Watanabe | 279/2.03 |
| 5,292,222 | 3/1994 | Malagrino, Jr. et al. | 414/786 |

FOREIGN PATENT DOCUMENTS

| | | |
|---|---|---|
| A-0383336 | 8/1990 | European Pat. Off. . |
| A-0379972 | 8/1990 | European Pat. Off. . |
| A-3146862 | 3/1983 | Germany . |
| U-9309935 | 9/1993 | Germany . |
| C-4341919 | 5/1995 | Germany . |
| 2-80568 | 3/1990 | Japan ............... 204/298.15 |
| WO 93/09538 | 5/1993 | WIPO . |

OTHER PUBLICATIONS

Patent Abstract of Japan, vol. 007, No. 090 (P–191), 14 Apr. 1983, (Oodeiotekunika:KK) 1 Feb. 1983 & JP,A,58 017502.

*Primary Examiner*—R. Bruce Breneman
*Assistant Examiner*—Rodney G. McDonald
*Attorney, Agent, or Firm*—Wolf, Greenfield & Sacks, P.C.

[57] ABSTRACT

Apparatus for locking a workpiece, such as a compact disc, in a vacuum chamber includes a locking mechanism, movable between a locked position and an unlocked position, and a sealed bellows assembly that is coupled to the locking mechanism. The locking mechanism is automatically actuated by the bellows assembly between the locked and unlocked positions when the pressure in the chamber is changed by a predetermined amount. The locking apparatus is preferably used for locking the compact disc to a disc holder during processing and/or handling.

16 Claims, 5 Drawing Sheets

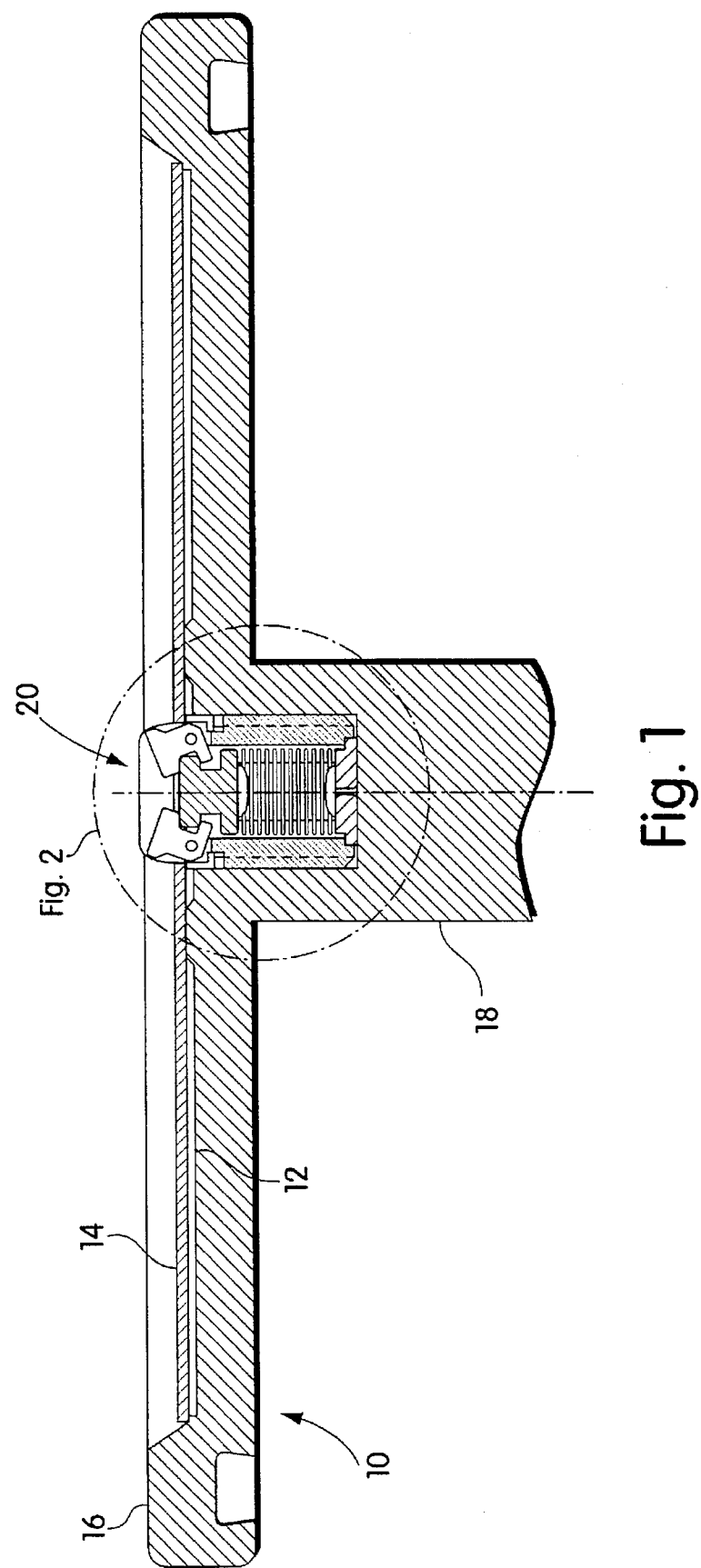

COMPACT DISK LOCKING APPARATUS

FIELD OF THE INVENTION

This invention relates to processing of workpieces in a vacuum chamber and, more particularly, to apparatus for automatically locking a compact disc to a holder.

BACKGROUND OF THE INVENTION

Compact discs have become a standard medium for recording of audio and video information in digital format. The replication of compact discs involves molding of a raw disc, sputtering a metallic coating on the raw disc to form a metallized disc and applying a lacquer coating to the metallized disc. The raw disc is molded plastic having data pits which contain digital information. The metallic coating forms a reflective layer that allows a scanning laser beam to read the digital information from the compact disc (CD). The lacquer coating functions as a protective layer for the metallic coating and provides a smooth surface for printing.

The metallic coating on compact discs may be deposited on the substrate in a sputtering system. The compact discs are loaded into a sputtering chamber. The pressure in the chamber is reduced from atmospheric pressure to a pressure on the order of $1.3 \times 10^{-3}$–$1.3 \times 10^{-2}$ mbar (1–10 mTorr) for processing. The loading, processing and unloading of the compact discs is preferably automated. Compact discs must be handled in a way that avoids damage. During processing, the compact disc may be locked to a holder without covering any of the active surface to which the metallic coating is applied. The locking mechanism must be able to operate in vacuum without generation of contaminants or particles. The locking mechanism should be simple in construction and low in cost.

U.S. Pat. No. 5,195,794 issued Mar. 23, 1993 to Hummel, Jr. et al discloses a compact disc lifting system in which a plunger moves perpendicular to the central opening in a compact disc. Fins are positioned in slots in a housing and include legs and arms meeting at acute angles inside a formed seat. When the plunger moves to its extended position, fins rotate the legs outwardly, thereby engaging the lower edge of the center opening of the compact disc. The disclosed device is designed for manual handling of compact discs and is not practical for use in a vacuum processing chamber.

SUMMARY OF THE INVENTION

According to the present invention, workpiece locking apparatus for use in a controllable pressure chamber is provided. The locking apparatus comprises a locking mechanism movable between a locked position for locking of the workpiece on a workpiece holder and an unlocked position for mounting and removal of the workpiece, and a sealed bellows assembly that is operatively coupled to the locking mechanism. The bellows assembly expands and contracts in response to pressure changes in the chamber. The locking mechanism is automatically actuated by the bellows assembly between the locked position and the unlocked position, when the pressure in the chamber is changed by a predetermined amount.

In a preferred embodiment, the workpiece comprises a disc having a center opening, and the locking mechanism is located in the center opening of the disc. Preferably, the locking apparatus includes a housing, and the locking mechanism and the bellows assembly are mounted in the housing. The locking mechanism may comprise a plurality of locking arms. Each of the locking arms is secured to the housing with a pivot pin for pivoting movement between the locked position and the unlocked position. The bellows assembly and the locking arms preferably include interlocking elements for transmitting motion of the bellows assembly to the locking arms.

In a first embodiment, the locking mechanism is actuated between the unlocked position at atmospheric pressure and the locked position at a low pressure. In a second embodiment, the locking mechanism is actuated between the locked position at atmospheric pressure and the unlocked position at a low pressure. The bellows assembly automatically actuates the locking mechanism between the locked and unlocked positions as the pressure in the chamber changes. The workpiece locking apparatus of the invention can be used for locking of a workpiece in a fixed position, or can be used for handling and transporting the workpiece within a vacuum chamber.

BRIEF DESCRIPTION OF THE DRAWINGS

For a better understanding of the present invention, reference is made to the accompanying drawings, which are incorporated herein by reference and in which:

FIG. 1 is a cross-sectional view of apparatus in accordance with a first embodiment of the present invention;

DETAILED DESCRIPTION

Figure 3:
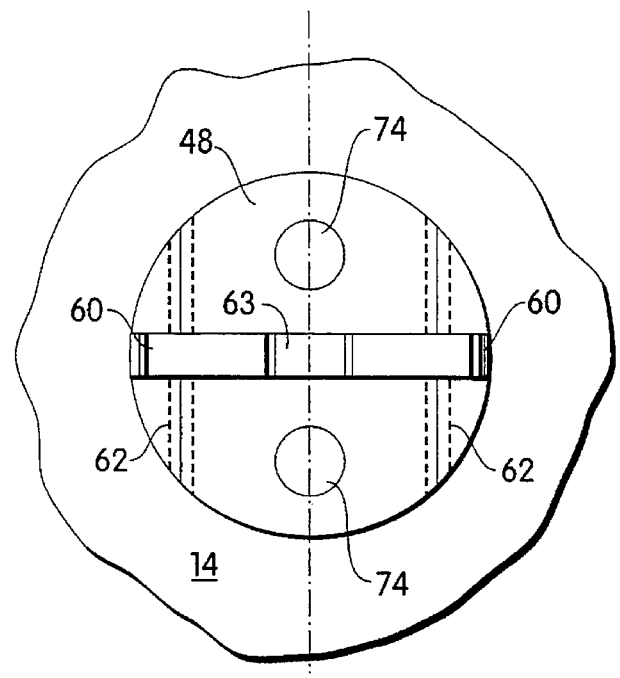
FIG. 3 is an enlarged top view of the locking apparatus of FIG. 2, shown in the unlocked position.

Apparatus in accordance with a first embodiment of the present invention is shown in FIG. 1. The apparatus shown in FIG. 1 is designed for holding a compact disc (CD) during processing in a vacuum chamber, such as a sputtering system. In the example of FIG. 1, a CD holder 10 includes a surface 12 for supporting and holding a compact disc 14. The holder 10 can be fabricated of a metal, such as aluminum, and may include a generally disc-shaped portion 16 supported by a central shaft 18. A locking apparatus 20 is located in the center opening of the CD 14. The locking apparatus is used for locking the CD 14 on the holder 10. It will be understood that the holder 10 can be used for holding partially completed or fully completed compact discs.

Figure 2:
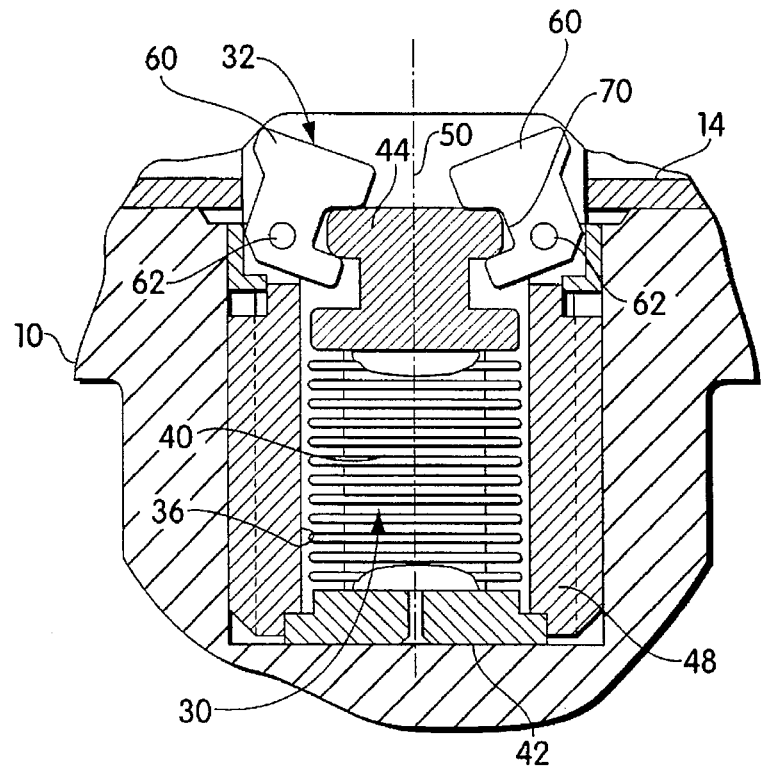
FIG. 2 is an enlarged, cross-sectional view of the first embodiment of the locking apparatus, shown in the unlocked position.
Figure 5:
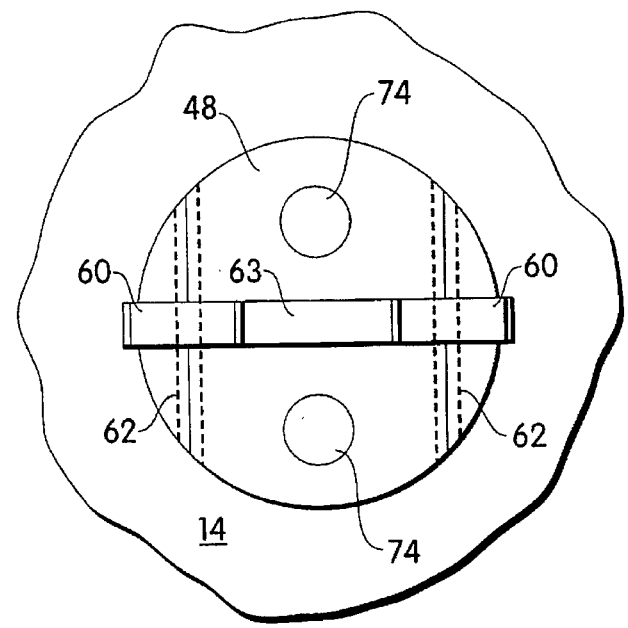
FIG. 5 is an enlarged top view of the locking apparatus of FIG. 2, shown in the locked position.
Figure 4:
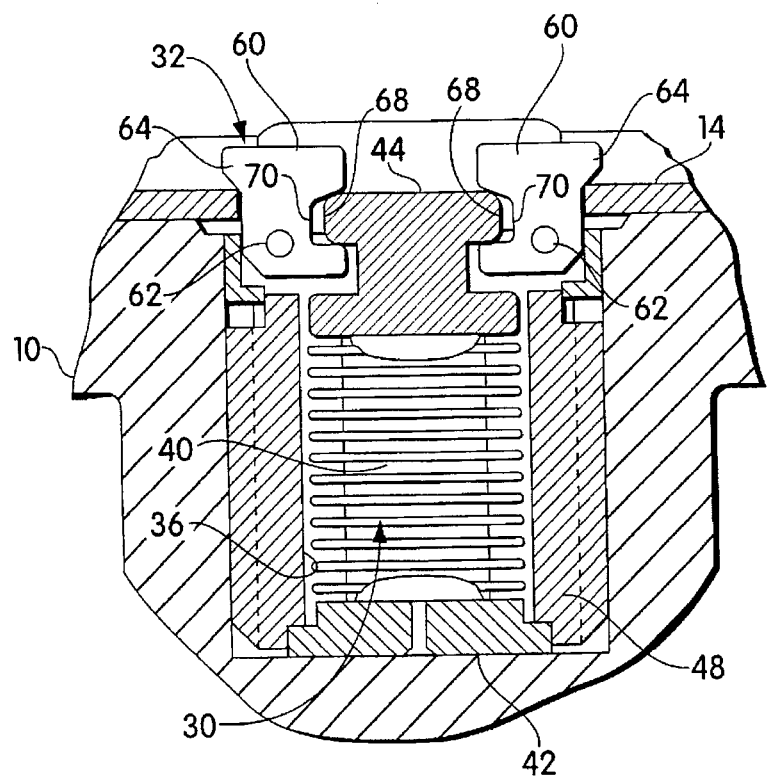
FIG. 4 is an enlarged, cross-sectional view of the locking apparatus of FIG. 2, shown in the locked position.

Enlarged cross-sectional views of the locking apparatus 20 are shown in FIGS. 2 and 4, and top views of the locking apparatus are shown in FIGS. 3 and 5, respectively. The locking apparatus 20 includes a bellows assembly 30, a locking mechanism 32 that is actuated by the bellows assembly 30, and a guide pin 48 in which the bellows assembly 30 and the locking mechanism 32 are mounted. The guide pin 48 functions as a housing for the bellows assembly 30 and the locking mechanism 32. The bellows assembly 30 is retained within a central bore 36 of guide pin 48. The central bore 36 is aligned with the center opening in CD 14. The bellows assembly 30 is automatically expandable between a contracted position, as shown in FIG. 2, and an expanded position, as shown in FIG. 4. In the contracted position of bellows assembly 30, the locking mechanism 32 is actuated to an unlocked position, shown in FIGS. 2 and 3, for mounting and removal of CD 14. In the expanded position of bellows assembly 30, the locking mechanism 32 is actuated to a locked position, shown in FIGS. 4 and 5, in which the CD 14 is held on guide pin 48 and is prevented from being lifted from holder 10.

The bellows assembly 30 includes an expandable bellows 40 that is sealed at one end by an upper end cap 42 and is sealed at the opposite end by a lower end cap 44. End cap 42 is secured in a fixed position in guide pin 48, which may be threaded into a bore in the center of holder 10. In the embodiment of FIGS. 2–5, the lower end cap 42 is secured to the end of guide pin 48. The upper end cap 44 is free to move along an axis 50 as the bellows assembly expands and contracts. The bellows 40 has a resilient spring-like configuration, as known in the art. A gas such as air is sealed within the bellows assembly 30.

The gas pressure is selected to provide controlled expansion and contraction of the bellows assembly as the ambient pressure varies. More particularly, the expansion and contraction of the bellows assembly is controlled by the spring constant of bellows 40, which tends to contract the bellows assembly, and the differential pressure between the interior and the exterior of the bellows assembly. For example, assume that air at atmospheric pressure is sealed within bellows assembly 30. When the vacuum chamber is at atmospheric pressure, the differential pressure between the interior and the exterior of the bellows assembly is zero, and the bellows 40 has its normal, unextended length. As shown in FIG. 2, the locking mechanism 32 is actuated to the unlocked position. Now, assume that the pressure in the vacuum chamber is reduced to a pressure on the order of 1–10 millitorr. The gas sealed within the bellows assembly 30 exerts outward forces on the end caps 42 and 44 of the bellows assembly, causing it to expand lengthwise along axis 50. Since the lower end cap 42 is fixed in position relative to guide pin 48, the upper end cap 44 moves upwardly, as shown in FIG. 4, and actuates clamping mechanism 32 to the clamped position. As long as the vacuum chamber is evacuated, the locking mechanism 32 remains in the locked position, and the CD 14 is held for processing. When processing is completed, the vacuum chamber is vented to atmosphere, and the locking mechanism 32 is automatically actuated to the unlocked position for removal of CD 14. It will be understood that the travel between expanded and contracted lengths depends on the characteristics of the bellows 40, including its spring constant, the gas pressure within bellows assembly 30 and the change in pressure in the vacuum chamber.

As shown in FIGS. 2–5, the locking mechanism 32 is mechanically coupled to the upper end cap 44 of bellows assembly 30. In the example of FIGS. 2–5, the locking mechanism 32 comprises a plurality of locking arms 60, each of which is mounted to guide pin 48 by a pivot pin 62 for pivoting movement between the unlocked position shown in FIGS. 2 and 3 and the locked position shown in FIGS. 4 and 5. The locking arms 60 are mounted in a slot 63 in guide pin 48. Each of the locking arms 60 includes a projection 64 that extends over CD 14 when the locking arm 60 is in the locked position and prevents the CD 14 from being removed from the holder 10. In the unlocked position, the locking arm 60 rotates about pivot pin 62 away from CD 14, thus permitting removal of CD 14 from the holder 10 and mounting of a new CD.

The locking arms 60 and the upper end cap 44 preferably include mechanically interlocking elements for transmitting movement of the bellows assembly 30 to the locking mechanism 32. In a preferred embodiment, the upper end cap 44 of bellows assembly 30 includes an outwardly extending rib 68 that engages and mechanically interlocks with a groove 70 in each of the locking arms 60. As the upper end cap 44 moves upwardly, the locking arm 60 is rotated about pivot pin 62 between the unlocked position shown in FIGS. 2 and 3 and the locked position shown in FIGS. 4 and 5. The unlocked position typically corresponds to atmospheric pressure within the vacuum chamber, and the locked position typically corresponds to the normal operating pressure within the vacuum chamber during processing. As shown, the locking arm 60 locks CD 14 to the guide pin 48 and prevents it from being lifted from holder 10.

As indicated above, the guide pin 48 is threaded into a bore in the center of holder 10. The guide pin 48 provides a housing for the bellows assembly 30 and the locking mechanism 32. The top of the guide pin 48 is provided with openings 74 which facilitate installation of the locking mechanism 32 in the holder 10 and which insure that the bellows assembly 30 is exposed to the pressure of the vacuum chamber.

In an example of the locking apparatus, the bellows assembly 30 has a diameter of about 0.38 inch (9.5 mm) and a contracted length of about 0.68 inch (17.3 mm), with a maximum travel between expanded and contracted lengths of about 0.04 inch (1 mm). The gas pressure within bellows assembly 30 is preferably about 1,013 mbar (760 Torr), for a pressure change of about 1,013 mbar (760 Torr). The locking arms 60 can be fabricated of a metal. A preferred embodiment includes two locking arms 60.

Figure 6:
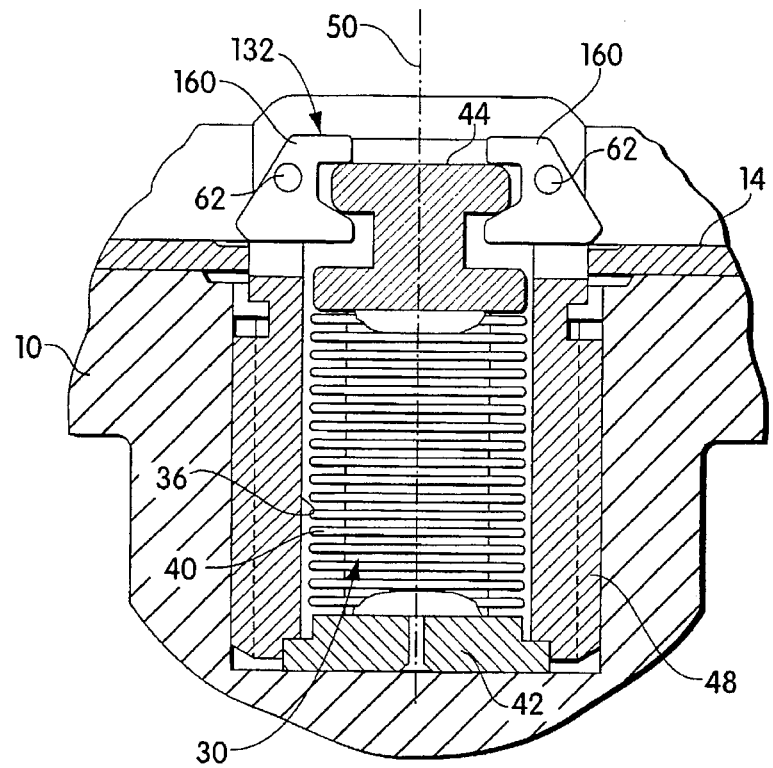
FIG. 6 is an enlarged, cross-sectional view of a second embodiment of the locking apparatus, shown in the locked position.
Figure 7:
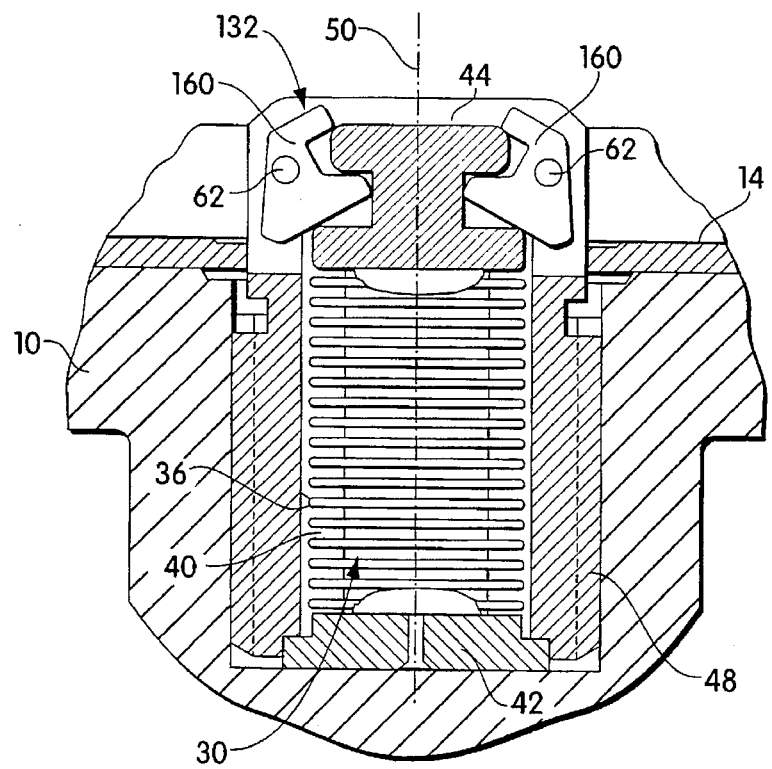
FIG. 7 is an enlarged, cross-sectional view of the locking apparatus of FIG. 6, shown in the unlocked position.

A second embodiment of the locking apparatus of the present invention is shown in FIGS. 6 and 7. Like elements in FIGS. 2–7 have the same reference numerals. As shown in FIGS. 6 and 7, bellows assembly 30 is mounted within guide pin 48. A locking mechanism 132 operatively connected to bellows assembly 30 includes locking arms 160, each of which is pivotally attached to guide pin 48 by pivot pin 62. The primary difference between the configuration of FIGS. 6 and 7 and the configuration of FIGS. 2–5 is that the locking apparatus of FIGS. 6 and 7 locks the CD 14 in position at a high pressure and unlocks the CD 14 at a low pressure. As shown in FIG. 6, the bellows 40 has its normal, unextended length at high pressure, and locking arms 160 are pivoted to locked positions above CD 14. When the pressure in the vacuum chamber is reduced to a low pressure as shown in FIG. 7, the bellows 40 expands along axis 50, and locking arms 160 are rotated to unlocked positions in which CD 14 can be removed from holder 10.

Figure 8:
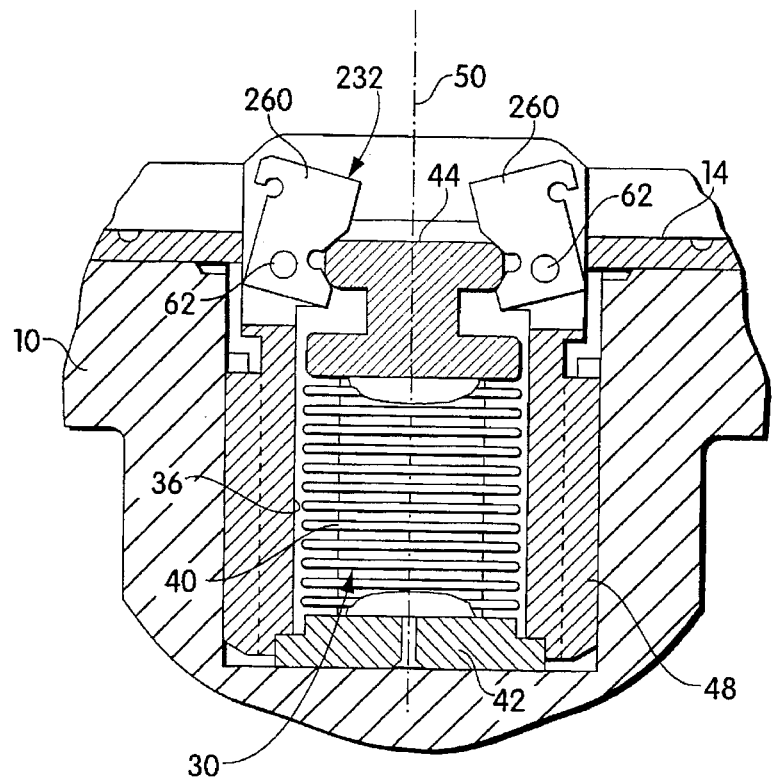
FIG. 8 is an enlarged, cross-sectional view of a third embodiment of the locking apparatus, shown in the unlocked position.
Figure 9:
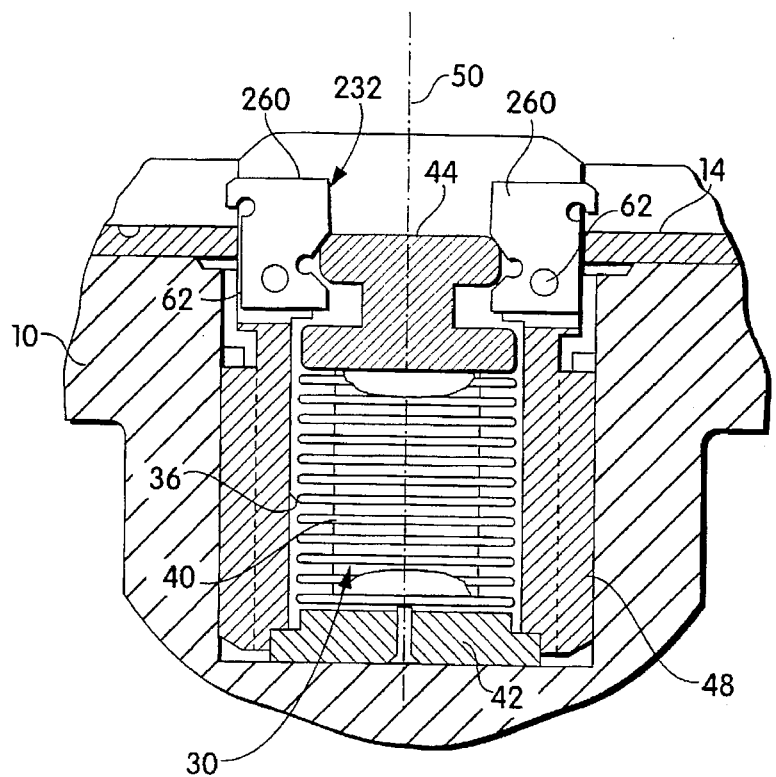
FIG. 9 is an enlarged, cross-sectional view of the locking apparatus of FIG. 8, shown in the locked position.

A third embodiment of the locking apparatus of the present invention is shown in FIGS. 8 and 9. Like elements in FIGS. 2–5 and 8–9 have the same reference numerals. The embodiment of FIGS. 8 and 9 is similar to the embodiment of FIGS. 2–5. The locking apparatus includes bellows assembly 30 mounted within guide pin 48. A locking mechanism 232 operatively connected to bellows assembly 30 includes locking arms 260, each of which is attached to guide pin 48 by pivot pin 62. At high pressure, the bellows assembly 30 has its normal, unextended length, and locking arms 260 are rotated away from CD 14 to unlocked positions, shown in FIG. 8, to permit CD 14 to be removed. At low pressure, the bellows assembly 30 expands, causing locking arms 260 to be rotated to locked positions as shown in FIG. 9. The locking arms 260 do not necessarily contact the CD 14 in either the unlocked or locked position. Each of the locking arms 260 has a hook-shaped projection which prevents the CD 14 from being lifted from the holder 10 when the locking arm 260 is in the locked position.

The locking apparatus of the present invention has been described in connection with locking a compact disc at its center opening. Numerous variations are included within the scope of the present invention. For example, the locking apparatus can be employed for holding or locking the compact disc at one or more points at its outer periphery. Furthermore, the locking apparatus can be used for locking different types of workpieces that may be handled and processed in a vacuum chamber. Any suitable locking mechanism can be actuated by the bellows assembly. All that is required is a locking mechanism that is movable between locked and unlocked positions and that is actuated by the bellows assembly as the bellows assembly expands and contracts under different pressure conditions. Any desired number of locking arms can be utilized. The disclosed locking apparatus provides automatic locking and unlocking of a workpiece as the pressure level in the vacuum chamber is changed. Thus, locking can be achieved with a minimum of complexity and cost.

While there have been shown and described what are at present considered the preferred embodiments of the present invention, it will be obvious to those skilled in the art that various changes and modifications may be made therein without departing from the scope of the invention as defined by the appended claims.

What is claimed is:

1. Workpiece locking apparatus for use in a controllable pressure chamber, comprising:
   a locking mechanism movable between a locked position for locking of a workpiece to a workpiece holder and an unlocked position for mounting and removal of the workpiece; and
   a sealed bellows assembly, said bellows assembly expanding and contracting in response to pressure changes in said chamber, said bellows assembly being operatively coupled to said locking mechanism so that said locking mechanism is automatically actuated by said bellows assembly between said locked position and said unlocked position when the pressure in said chamber is changed by a determined amount.

2. Workpiece locking apparatus as defined in claim 1 wherein said workpiece comprises a disc having a center opening and wherein said locking mechanism is located in the center opening of said disc.

3. Workpiece locking apparatus as defined in claim 2 further including a housing, said locking mechanism and said bellows assembly being mounted in said housing.

4. Workpiece locking apparatus as defined in claim 3 wherein said locking mechanism comprises a pivot pin secured to said housing and a locking arm attached to said pivot pin for pivoting movement between said locked position and said unlocked position.

5. Workpiece locking apparatus as defined in claim 3 wherein said locking mechanism comprises a plurality of locking arms, each secured to said housing with a pivot pin for pivoting movement between said locked position and said unlocked position.

6. Workpiece locking apparatus as defined in claim 5 wherein said bellows assembly and said locking arms include interlocking elements for transmitting motion of said bellows assembly to said locking arms.

7. Workpiece locking apparatus as defined in claim 5 wherein said bellows assembly includes a bellows, a first end cap sealed to one end of said bellows and a second end cap sealed to the other end of said bellows, said first end cap being mounted in a fixed position relative to said housing, said second end cap being movable and being operatively coupled to said locking arms.

8. Workpiece locking apparatus as defined in claim 7 wherein said second end cap and said locking arms include interlocking elements for transmitting motion of said bellows assembly to said locking arms.

9. Workpiece locking apparatus as defined in claim 8 wherein said interlocking elements comprise a rib on said second end cap and a groove for engaging said rib on each of said locking arms.

10. Workpiece locking apparatus as defined in claim 1 wherein the pressure in said chamber is changed from atmospheric pressure to a low pressure relative to atmospheric pressure, whereby said locking mechanism is actuated between said unlocked position at atmospheric pressure and said locked position at said low pressure.

11. Workpiece locking apparatus as defined in claim 1 wherein the pressure in said chamber is changed from atmospheric pressure to a low pressure relative to atmospheric pressure, whereby said locking mechanism is actuated between said locked position at atmospheric pressure and said unlocked position at said low pressure.

12. Apparatus for locking a disc having a center opening in a vacuum processing chamber, comprising:
   a disc holder having a disc holding surface;
   a guide pin centrally located on said disc holding surface;
   a plurality of locking members mounted in said guide pin for pivoting movement between a first position wherein a disc is locked to said disc holder and a second position wherein said disc can be mounted on or removed from said disc holder; and
   a sealed bellows assembly mounted in said guide pin, said bellows assembly expanding and contracting in response to pressure changes in said chamber, said bellows assembly being coupled to said locking members so that said locking members are actuated by said bellows assembly between said first and second positions when the pressure in said chamber is changed by a determined amount.

13. Apparatus as defined in claim 12 wherein the pressure in said chamber is changed from atmospheric pressure to a low pressure relative to atmospheric pressure, whereby said locking members are actuated between said second position at atmospheric pressure and said first position at said low pressure.

14. Apparatus as defined in claim 12 wherein the pressure in said chamber is changed from atmospheric pressure to a low pressure relative to atmospheric pressure, whereby said locking members are actuated between said first position at atmospheric pressure and said second position at said low pressure.

15. Apparatus as defined in claim 12 wherein said bellows assembly and said locking members include interlocking elements for transmitting motion of said bellows assembly to said locking members.

16. Apparatus as defined in claim 15 wherein said bellows assembly includes a bellows, a first end cap sealed to one end of said bellows and a second cap sealed to the other end of said bellows, said first end cap being mounted in a fixed position relative to said guide pin, said second end cap being movable and being operatively coupled to said locking members.

* * * * *